(12) United States Patent
Yamaguchi

(10) Patent No.: US 8,334,916 B2
(45) Date of Patent: Dec. 18, 2012

(54) SOLID-STATE IMAGE SENSOR WITH REDUCED SIGNAL NOISE

(75) Inventor: Tetsuya Yamaguchi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 12/725,625

(22) Filed: Mar. 17, 2010

(65) Prior Publication Data

US 2010/0302424 A1 Dec. 2, 2010

(30) Foreign Application Priority Data

May 29, 2009 (JP) ................. 2009-130589

(51) Int. Cl.
*H04N 5/335* (2006.01)
*H04N 3/14* (2006.01)

(52) U.S. Cl. ............. 348/294; 348/308; 257/72

(58) Field of Classification Search ........... 348/300, 348/308, E5.091
See application file for complete search history.

(56) References Cited

U.S. PATENT DOCUMENTS

| | | | |
|---|---|---|---|
| 6,521,920 B2 * | 2/2003 | Abe | 257/223 |
| 7,554,141 B2 | 6/2009 | Yamaguchi et al. | |
| 7,889,255 B2 * | 2/2011 | Inoue et al. | 348/302 |
| 2007/0108487 A1 * | 5/2007 | Inoue et al. | 257/292 |
| 2008/0012088 A1 | 1/2008 | Yamaguchi et al. | |
| 2008/0083939 A1 * | 4/2008 | Guidash | 257/292 |
| 2010/0033607 A1 * | 2/2010 | Komatsu et al. | 348/273 |
| 2011/0037854 A1 * | 2/2011 | Godaiin | 348/164 |

FOREIGN PATENT DOCUMENTS

JP 2006-286933 10/2006

* cited by examiner

*Primary Examiner* — Hung Lam

(74) *Attorney, Agent, or Firm* — Oblon, Spivak, McClelland, Maier & Neustadt, L.L.P.

(57) ABSTRACT

A solid-state image sensor includes a semiconductor layer having a first conductive type, diffusion layers which are arranged in the semiconductor layer, each having a second conductive type, and each includes a pixel, a pixel transistor disposed on the semiconductor layer, and an insulating layer which is disposed under the pixel transistor and which is not disposed under the diffusion layers. The pixel transistor is disposed between the other pixels different from the pixel being electrically connected to the pixel transistor.

20 Claims, 10 Drawing Sheets

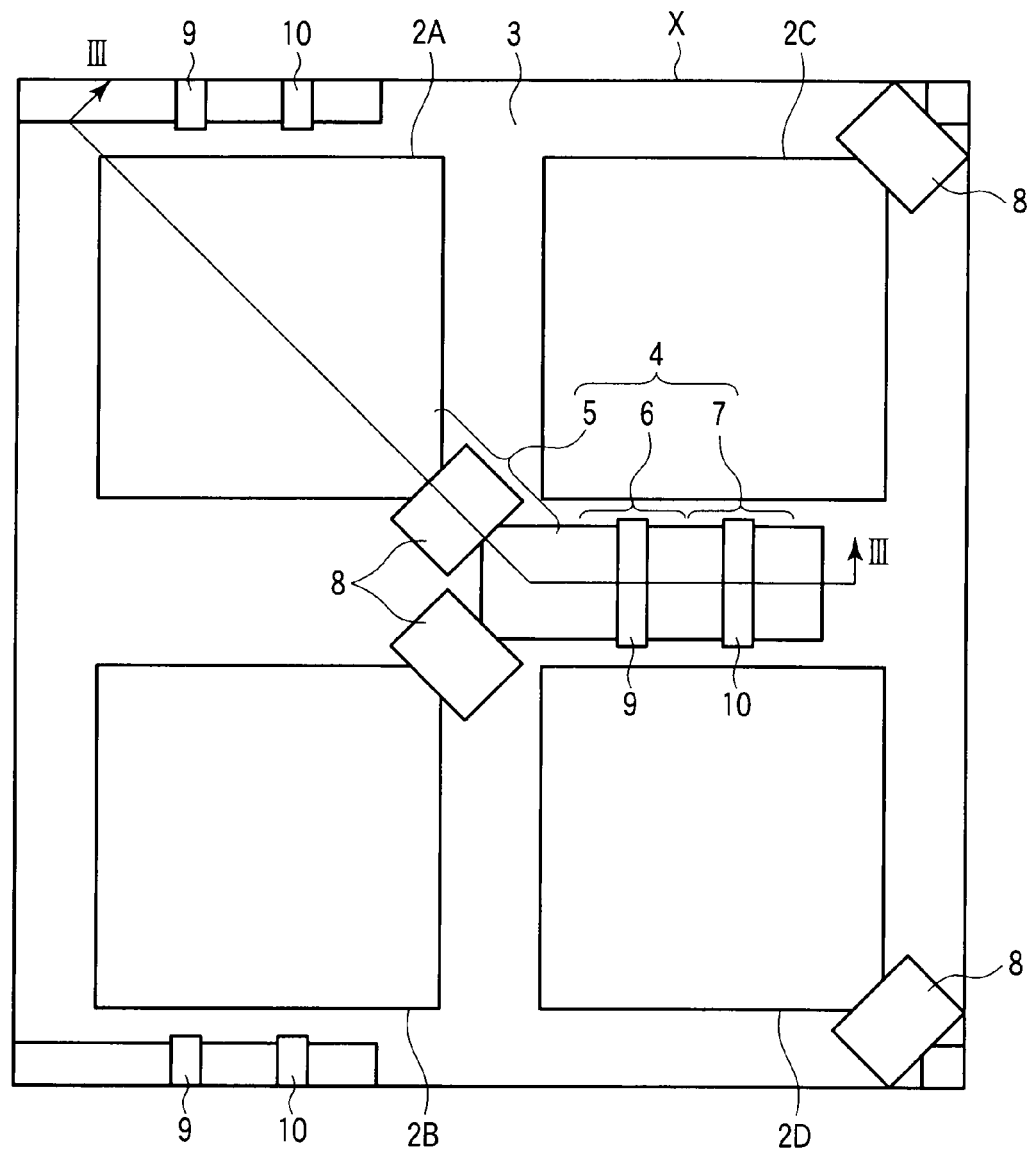
F I G. 2

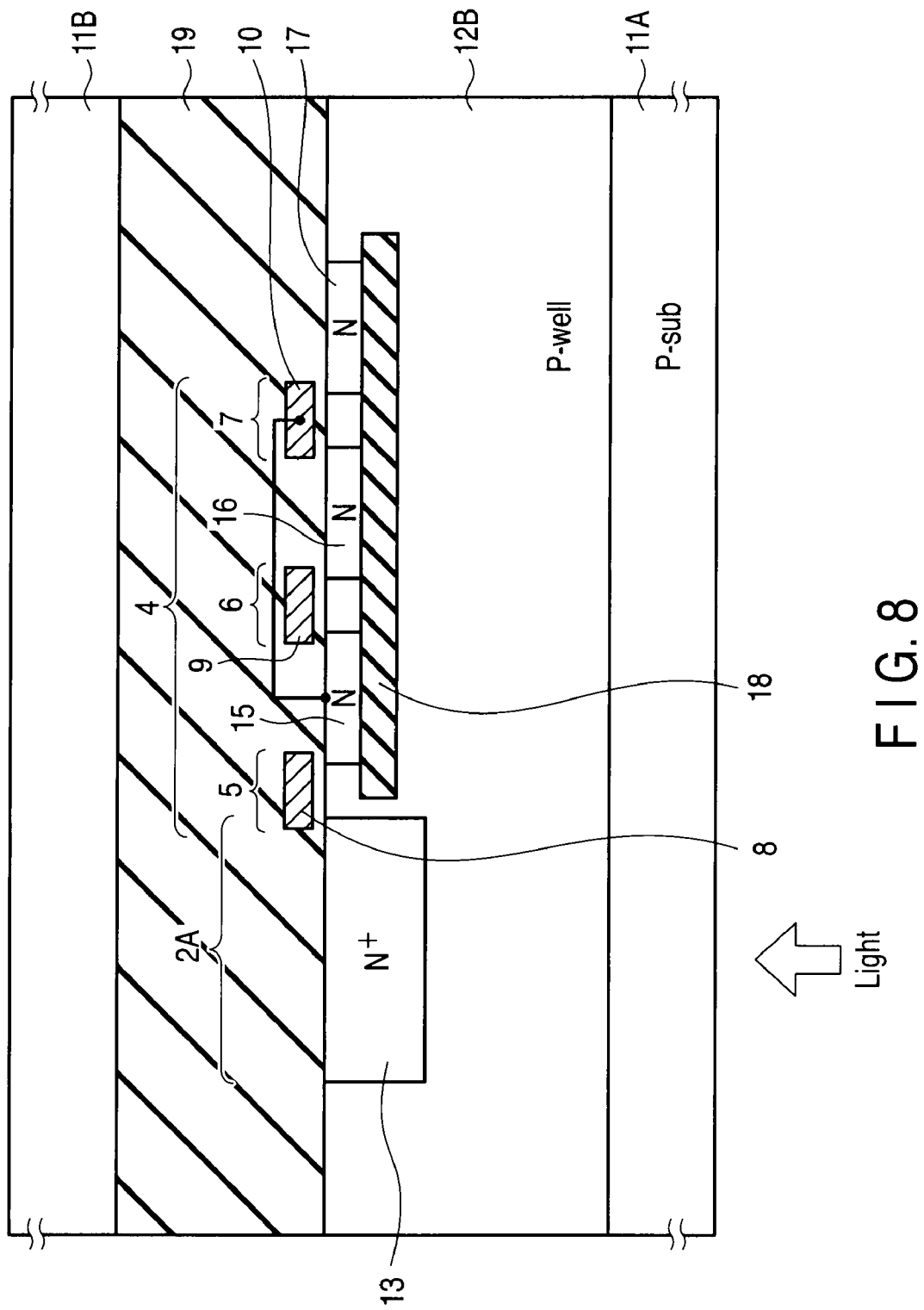
F I G. 8

SOLID-STATE IMAGE SENSOR WITH REDUCED SIGNAL NOISE

CROSS-REFERENCE TO RELATED APPLICATIONS

This application is based upon and claims the benefit of priority from prior Japanese Patent Application No. 2009-130589, filed May 29, 2009, the entire contents of which are incorporated herein by reference.

BACKGROUND OF THE INVENTION

1. Field of the Invention

The present invention relates to a solid-state image sensor.

2. Description of the Related Art

CMOS image sensors are known as a type of solid-state image sensors. CMOS image sensors have features such as a single power supply, low-voltage driving, and low power consumption. Like CCDs, CMOS image sensors have been developed to have a greater number of pixels and a micro size, and to form photodiodes and transistors on the same substrate.

In CMOS image sensors, an electric potential of a part accumulating signal charges is modulated by signal charges generated by a photoelectric conversion element. Amplifier transistors inside pixels are modulated by the modulated electric potential, to perform an amplifier function inside the pixels.

Properly providing electrical isolation between photodiodes is very significant for CMOS image sensors to reduce signal noise. For example, if the photodiodes are constituted by N-type epitaxial layers and P-type diffusion layers. The electrical isolation is achieved by a P-type diffusion layer which surrounds another diffusion layer (for example, see Jpn. Pat. Appln. KOKAI Publication No. 2006-286933).

In some cases, however, signal noise occurs even with this electrical isolation provided.

Specifically, each of pixel transistors for reading signals from the photodiodes is constituted by a read transistor, a reset transistor, and an amplifier transistor, which are formed on a P-type diffusion layer.

When light is obliquely incident on the photodiodes in the configuration as described above, electrons are generated in a P-type diffusion layer (i.e., a neutral area of zero electric field) in some cases.

Electrons generated in the P-type diffusion layer move by diffusion to a different pixel transistor (for example, a detection portion of a read transistor) from a pixel transistor which originally should have detected the generated electrons, and become signal noise.

BRIEF SUMMARY OF THE INVENTION

A solid-state image sensor according to an aspect of the present invention comprises a semiconductor layer having a first conductive type, diffusion layers which are arranged in the semiconductor layer, each having a second conductive type, and each comprising a pixel, a pixel transistor disposed on the semiconductor layer, and an insulating layer which is disposed under the pixel transistor and which is not disposed under the diffusion layers, wherein the pixel transistor is disposed between the other pixels different from the pixel being electrically connected to the pixel transistor.

BRIEF DESCRIPTION OF THE SEVERAL VIEWS OF THE DRAWINGS

FIG. 2 is a plain view of a part of a pixel area.
FIGS. 7 and 8 are cross-sectional views, each showing a back illuminated imager.

DETAILED DESCRIPTION OF THE INVENTION

A solid-state image sensor of the disclosure will be described below in detail with reference to the accompanying drawings.

A CMOS image sensor will be described below as an example of the solid-state image sensor.

1. Device Structure (1) Plain View

Figure 1:
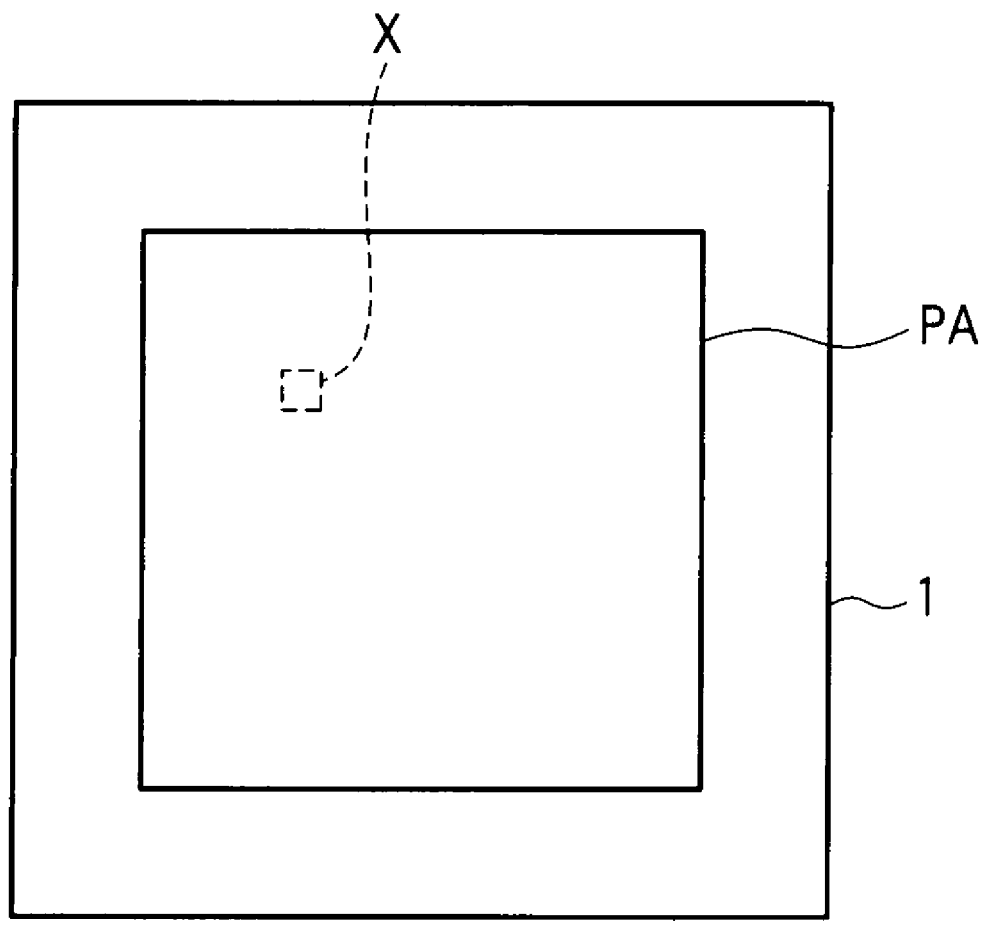
FIG. 1 is a plain view of a CMOS image sensor.

FIG. 1 is a plain view of a CMOS image sensor.

Pixel area PA forming a main par of the CMOS image sensor is formed in chip 1. The other area than pixel area PA forms a peripheral circuit area.

Pixel area PA is constituted by pixels.

FIG. 2 shows part X in pixel area PA in FIG. 1.

Pixels 2A, 2B, 2C, and 2D are arrayed in a matrix. Pixels 2A, 2B, 2C, and 2D each are formed of a photodiode as a photoelectric conversion element.

Pixel transistor 4 for reading a signal from the photodiodes is provided in an area between pixels 2A, 2B, 2C, and 2D. In this example, one pixel transistor 4 is provided for two pixels 2A and 2B.

Pixel transistor 4 is constituted by, for example, read transistor 5, reset transistor 6, and amplifier transistor 7. These transistors are, for example, field effect transistors (FETs).

Read transistor 5, reset transistor 6, and amplifier transistor 7 respectively comprise gates 8, 9, and 10.

A diffusion layer for electrically isolating pixels 2A, 2B, 2C, and 2D is provided immediately below pixel transistor 4.

Pixel transistor 4 for pixels 2A and 2B is arranged so as to extend from between ends of pixels 2A and 2B to between other pixels 2C and 2D than the pixels 2A and 2B.

By applying a layout as described above, for example, electrons which are generated in the diffusion layer by light obliquely incident on pixels 2A and 2B enter into pixel transistor 4 for pixels 2A and 2B, and may possibly become signal noise.

Hence, a device structure for preventing the signal noise will now be described below.

(2) Cross-Sectional View

Figure 3:
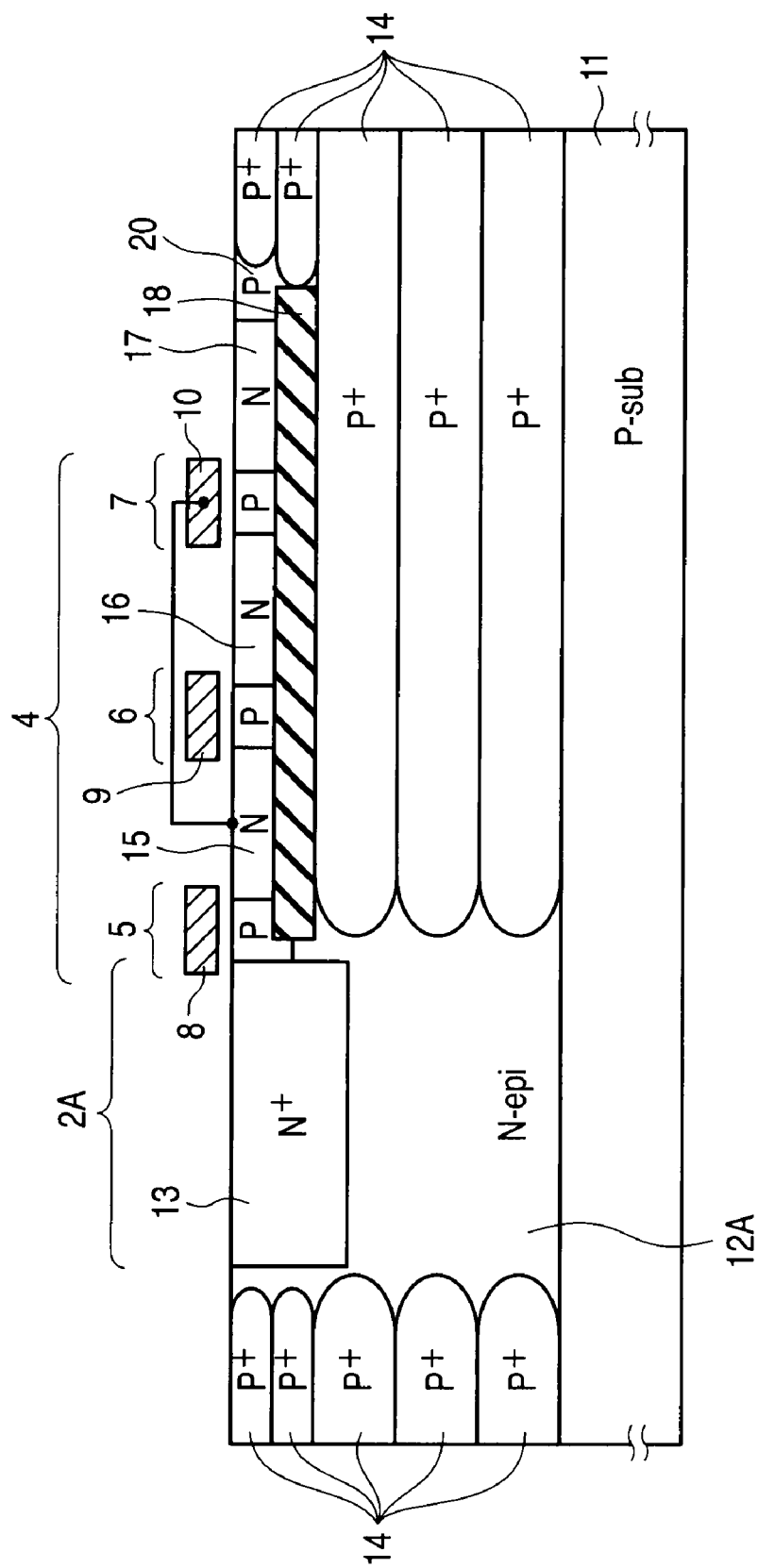
FIG. 3 is a cross-sectional view of a first example of a device structure.

FIG. 3 shows a first example of the device structure.

This figure is a cross-sectional view along line III-III in FIG. 2.

N-type epitaxial layer (N-epi) 12A is provided on P-type semiconductor substrate (P-sub) 11. $N^+$-type diffusion layer 13 is provided in N-type epitaxial layer 12A. Each photodiode is formed of P-type diffusion layers 14, N-type epitaxial layer 12A, and $N^+$-type diffusion layer 13.

$P^+$-type diffusion layers 14 and P-type well regions 20 are provided in N-type epitaxial layer 12A. $P^+$-type diffusion layers 14 surround the photodiodes and thereby achieve electrical isolation of each photodiode.

Pixel transistor 4 for reading a signal from pixel (photodiode) 2A is provided on P-type well regions 20 above $P^+$-type diffusion layers 14.

Pixel transistor 4 is constituted by, for example, read transistor 5, reset transistor 6, and amplifier transistor 7 which are connected in series. These transistors are constituted by, for example, N-channel type FETs.

Read transistor 5, reset transistor 6, and amplifier transistor 7 respectively comprise gates 8, 9, and 10. Read transistor 5 is connected to a corner of $N^+$-type diffusion layer 13 having a rectangular plan shape.

N-type diffusion layers 15, 16, and 17 each form source/drain of pixel transistor 4. Of these layers, N-type epitaxial layer 15 to form a drain of read transistor 5 is particularly called a detection portion. N-type diffusion layer 15 as the detection portion is electrically connected to gate 10 of amplifier transistor 7.

In this example, insulating layer 18 is provided between pixel transistor 4 and $P^+$-type diffusion layers 14. Insulating layer 18 is formed of oxide, nitride, carbide, or oxynitride.

This insulating layer 18 eliminates possibility that electrons which are generated in $P^+$-type diffusion layers 14 by light obliquely incident on pixels 2C and 2D in FIG. 2 enter into pixel transistor 4 of pixel 2A and become signal noise.

Specifically, electrons generated in $P^+$-type diffusion layers 14 do not enter into pixel transistor 4 of pixel 2A, and signal noise therefore can be reduced.

In addition, existence of insulating layer 18 is considered to cause the electrons generated in $P^+$-type diffusion layers 14 to return into the pixel ($N^+$-type diffusion layer 13) which originally should detect the electrons. Accordingly, the existence of insulating layer 18 contributes to improvement in sensitivity of photodiodes.

In this example, however, insulating layer 18 is not provided immediately below pixel 2A.

This is to configure $N^+$-type diffusion layer 13 forming each photodiode so as to have a sufficient depth and to thereby improve sensitivity of the photodiode.

Specifically, a bottom surface of $N^+$-type diffusion layer 13 is formed at a lower position than an upper surface of insulating layer 18.

N-type epitaxial layer 12A is replaceable with a P-type epitaxial layer.

As has been described above, according to the first example of the device structure, signal noise of the CMOS image sensor as a solid-state image sensor can be reduced.

Figure 4:
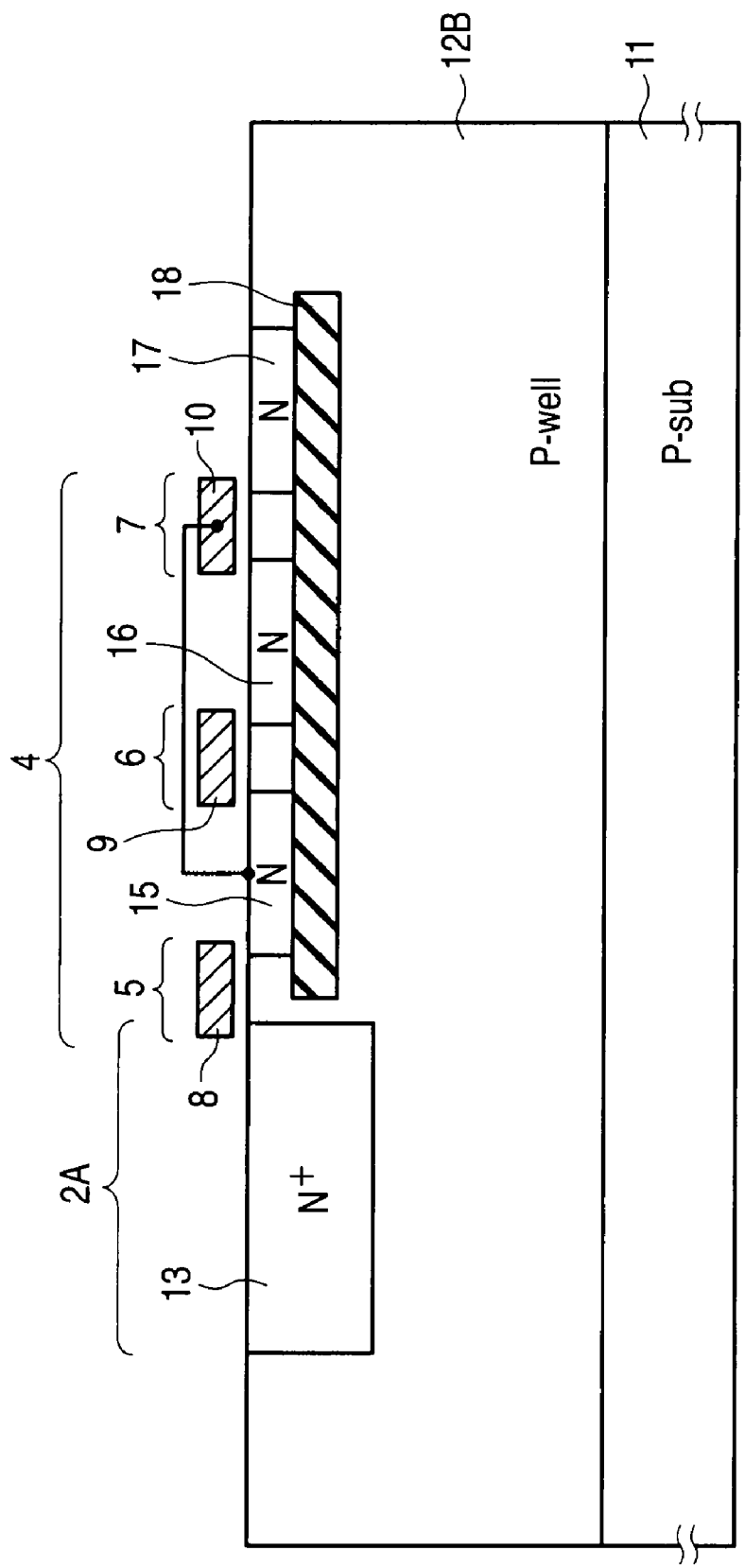
FIG. 4 is a cross-sectional view of a second example of a device structure.

FIG. 4 shows the second example of the device structure.

This figure is a cross-sectional view along line III-III in FIG. 2.

P-type well region (P-well) 12B is provided in P-type semiconductor substrate (P-sub) 11. $N^+$-type diffusion layer 13 is provided in P-type well region 12B. Photodiodes each are constituted by P-type well region 12B and $N^+$-type diffusion layer 13.

Pixel transistor 4 for reading a signal from pixel (photodiode) 2A is provided above P-type well region 12B.

Pixel transistor 4 is constituted by, for example, read transistor 5, reset transistor 6, and amplifier transistor 7 which are connected in series. These transistors are constituted by, for example, FETs.

Read transistor 5, reset transistor 6, and amplifier transistor 7 respectively comprise gates 8, 9, and 10.

N-type diffusion layers 15, 16, and 17 each form source/drain of Pixel transistor 4. Of these layers, N-type epitaxial layer 15 to form a drain of read transistor 5 is particularly called a detection portion. N-type diffusion layer 15 as the detection portion is electrically connected to gate 10 of amplifier transistor 7.

In this example, insulating layer 18 is provided between pixel transistor 4 and $P^+$-type well region 12B. Insulating layer 18 is formed of oxide, nitride, carbide, or oxynitride.

This insulating layer 18 eliminates possibility that electrons which are generated in P-type well region 12B by light obliquely incident on pixels 2C and 2D in FIG. 2 enter into pixel transistor 4 of pixel 2A and become signal noise.

Specifically, electrons generated in P-type well region 12B do not enter into pixel transistor 4 of pixel 2A, and signal noise therefore can be reduced.

In addition, existence of insulating layer 18 is considered to cause the electrons generated in P-type well region 12B to return into the pixel ($N^+$-type diffusion layer 13) which originally should detect the electrons. Accordingly, the existence of insulating layer 18 contributes to improvement in sensitivity of photodiodes.

In this example, however, insulating layer 18 is not provided immediately below pixel 2A.

This is to configure $N^+$-type diffusion layer 13 forming each photodiode so as to have a sufficient depth and to thereby improve sensitivity of the photodiode.

Specifically, a bottom surface of $N^+$-type diffusion layer 13 is formed at a lower position than an upper surface of insulating layer 18.

As has been described above, according to the second example of the device structure, signal noise of the CMOS image sensor as a solid-state image sensor can be reduced.

The first and second examples are applicable to both of front-illumination-type CMOS image sensors and back-illumination-type CMOS image sensors.

In the front-illumination-type CMOS image sensors, light enters from a surface in the side where pixel transistor 4 is formed. In contrast, in the back-illumination-type CMOS image sensors, light enters from a surface opposite to the side where pixel transistor 4 is formed.

The back-illumination-type has a feature that light incident on photodiodes is not affected by obstacles such as interconnections formed above pixel transistors 4 and a numerical aperture can accordingly be improved.

Also, the back-illumination-type is considered to increase quantity of electrons generated in $P^+$-type diffusion layer 14. Therefore, the disclosure is particularly effective when applied to the back-illumination-type.

2. Manufacturing Method

Described below will be methods for manufacturing solid-state image sensors having the device structures shown in FIGS. 3 and 4.

(1) Device Structure Shown in FIG. 3

Figure 5:
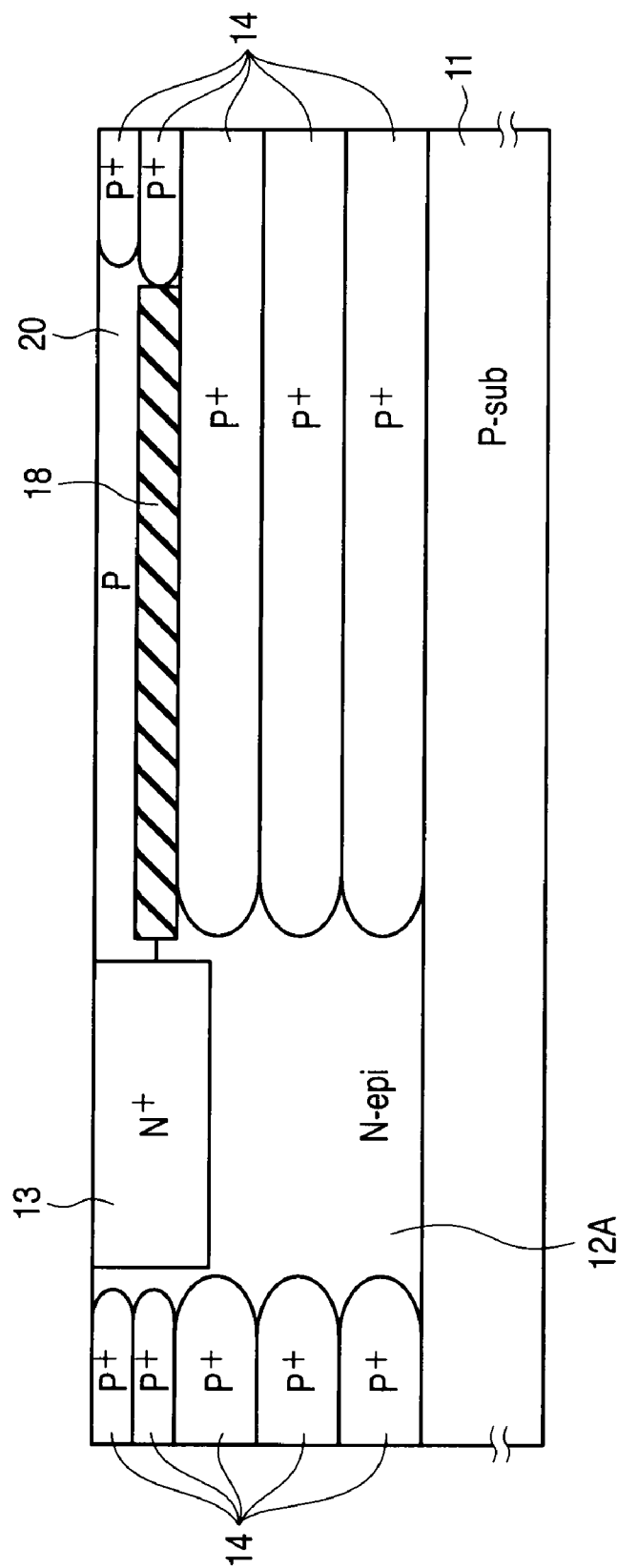
FIGS. 5 and 6 are views, each showing a manufacturing method.

At first, as shown in FIG. 5, N-type epitaxial layer (semiconductor layer) 12A having thickness of approximately 3 μm is formed on P-type semiconductor substrate (P-sub) 11 by epitaxial growth.

Next, a mask material (such as a resist) is formed on N-type epitaxial layer 12A. Masked with the mask material, oxygen (O) ions are ion-implanted, for example, at acceleration energy of 300 KV and a dose amount of $1 \times 10^{15}$ to $1 \times 10^{16}$ $cm^{-2}$.

Thereafter, the mask material is removed. If the mask material is formed of a resist, the resist is removed by using a mixed solution of a sulfuric acid and a hydrogen peroxide solution.

Subsequently, a heat treatment is performed, for example, at a temperature of 1,150° C. for thirty minutes, to form insulating layer 18 in N-type epitaxial layer 12A. Depth of insulating layer 18 is so set that, for example, width from a surface of N-type epitaxial layer 12A to an upper surface of insulating layer 18 is approximately 0.5 μm.

In this example, insulating layer 18 is formed of silicon oxide, which may be replaced with silicon oxide or silicon carbide by implanting, for example, nitrogen ions or carbon ions.

Next, N$^+$-type diffusion layer 13 is formed in the N-type epitaxial layer 12A, to form a photodiode as a photoelectric conversion element.

N$^+$-type diffusion layer 13 is formed by providing again a mask material (such as a resist) on N-type epitaxial layer 12A and by further ion-implanting phosphorus (P) ions, for example, at acceleration energy of 150 KV and a dose amount of $1.3 \times 10^{12}$ cm$^{-2}$, with the mask material used as a mask.

To provide photodiodes with high sensitivity, the bottom surface of N$^+$-type diffusion layer 13 is formed at a lower position than the upper surface of insulating layer 18.

Thereafter, the mask material is removed. If the mask material is formed of a resist, the resist is removed by using a mixed solution of a sulfuric acid and a hydrogen peroxide solution.

Next, P$^+$-type diffusion layers 14 and P-type well regions 20 are formed in the N-type epitaxial layer 12A, to electrically isolate each photodiode as a photoelectric conversion element.

P$^+$-type diffusion layers 14 are formed by providing again a mask material (such as a resist) on N-type epitaxial layer 12A and by further ion-implanting boron (B) ions, for example, at acceleration energy of 400 KV, 800 KV, 1,200 KV, 1,600 KV, 2,000 KV, and 2,400 KV, respectively, and at a dose amount of $1 \times 10^{12}$ cm$^{-2}$, with the mask material used as a mask.

Next, as shown in FIG. 3, pixel transistor 4 is formed on P-type well regions 20 above insulating layer 18.

At first, gate 8 of read transistor 5, gate 9 of reset transistor 6, and gate 10 of amplifier transistor 7 each are formed on the P-type well regions 20.

Thereafter, a mask material (such as a resist) is provided on the P-type well region 20, and phosphorus (P) ions are ion-implanted, according to gate self-alignment, into P-type well region 20 at acceleration energy of 20 KV and a dose amount of $1.3 \times 10^{12}$ cm$^{-2}$.

In this manner, pixel transistor 4 is formed on P-type well regions 20 above insulating layer 18.

The device structure in FIG. 3 is completed through process as described above.

(2) Device Structure in FIG. 4

Figure 6:
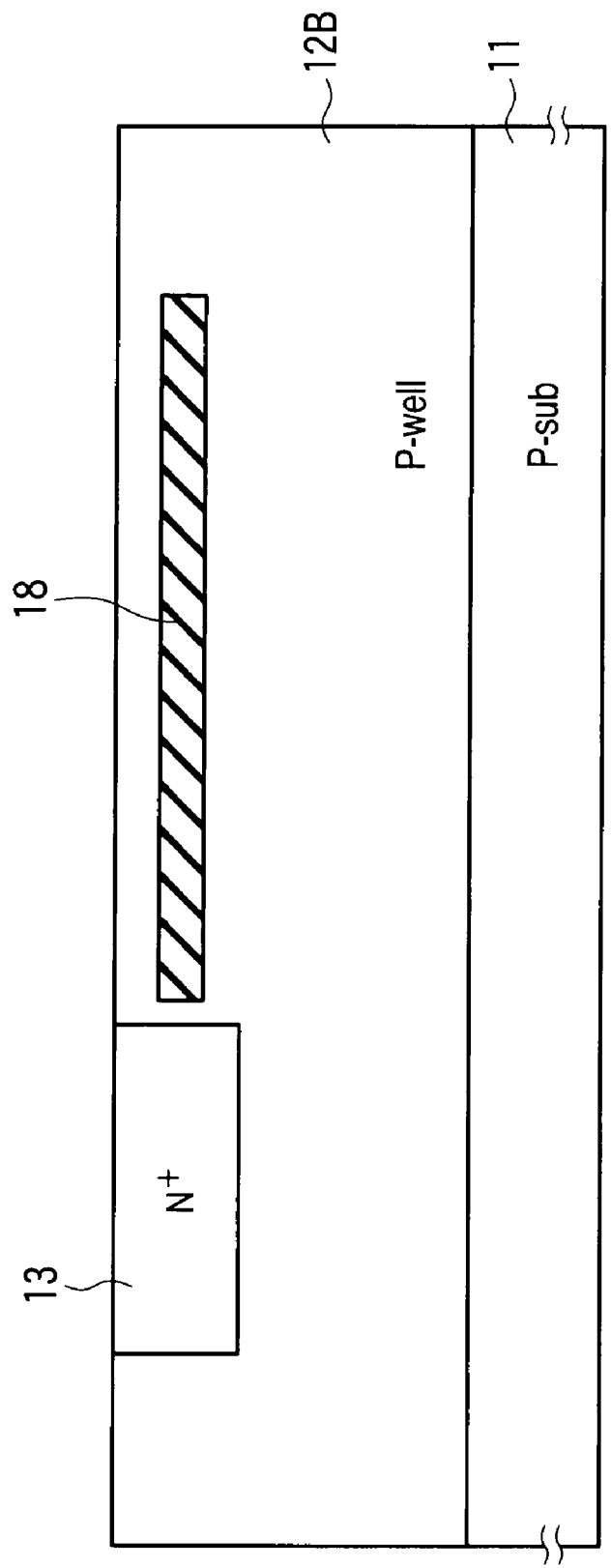

At first, as shown in FIG. 6, P-type well region 12B is formed on P-type semiconductor substrate (P-sub) 11.

Next, a mask material (such as a resist) is formed on P-type well region 12B. Masked with the mask material, oxygen (O) ions are ion-implanted, for example, at acceleration energy of 300 KV and a dose amount of $1 \times 10^{15}$ to $1 \times 10^{16}$ cm$^{-2}$.

Thereafter, the mask material is removed. If the mask material is formed of a resist, the resist is removed by using a mixed solution of a sulfuric acid and a hydrogen peroxide solution.

Subsequently, a heat treatment is performed, for example, at a temperature of 1,150° C. for thirty minutes, to form insulating layer 18 partially in P-type well region 12B. Depth of insulating layer 18 is so set that, for example, width from a surface of P-type well region 12B to an upper surface of insulating layer 18 is approximately 0.5 μm.

In this example, insulating layer 18 is formed of silicon oxide, which may be replaced with silicon oxide or silicon carbide by implanting, for example, nitrogen ions or carbon ions.

Next, N$^+$-type diffusion layer 13 is formed in the P-type well region 12B, to form a photodiode as a photoelectric conversion element.

N$^+$-type diffusion layer 13 is formed by providing again a mask material (such as a resist) on P-type well region 12B and by further ion-implanting phosphorus (P) ions, for example, at acceleration energy of 150 KV and a dose amount of $1.3 \times 10^{12}$ cm$^{-2}$, with the mask material used as a mask.

To provide photodiodes with high sensitivity, the bottom surface of N$^+$-type diffusion layer 13 is formed at a lower position than the upper surface of insulating layer 18.

Thereafter, the mask material is removed. If the mask material is formed of a resist, the resist is removed by using a mixed solution of a sulfuric acid and a hydrogen peroxide solution.

Next, as shown in FIG. 4, pixel transistor 4 is formed on P-type well region 12B above insulating layer 18.

At first, gate 8 of read transistor 5, gate 9 of reset transistor 6, and gate 10 of amplifier transistor 7 each are formed on the P-type well region 20.

Thereafter, a mask material (such as a resist) is provided on P-type well region 12B, and phosphorus (P) ions are ion-implanted, according to gate self-alignment, into P-type well region 12B at acceleration energy of 20 KV and a dose amount of $1.3 \times 10^{12}$ cm$^{-2}$.

In this manner, pixel transistor 4 is formed on P-type well region 12B on insulating layer 18.

The device structure in FIG. 4 is completed through process as described above.

3. Application Example (1) Back-Illumination-Type CMOS Image Sensor (Back Illuminated Imager)

Figure 7:
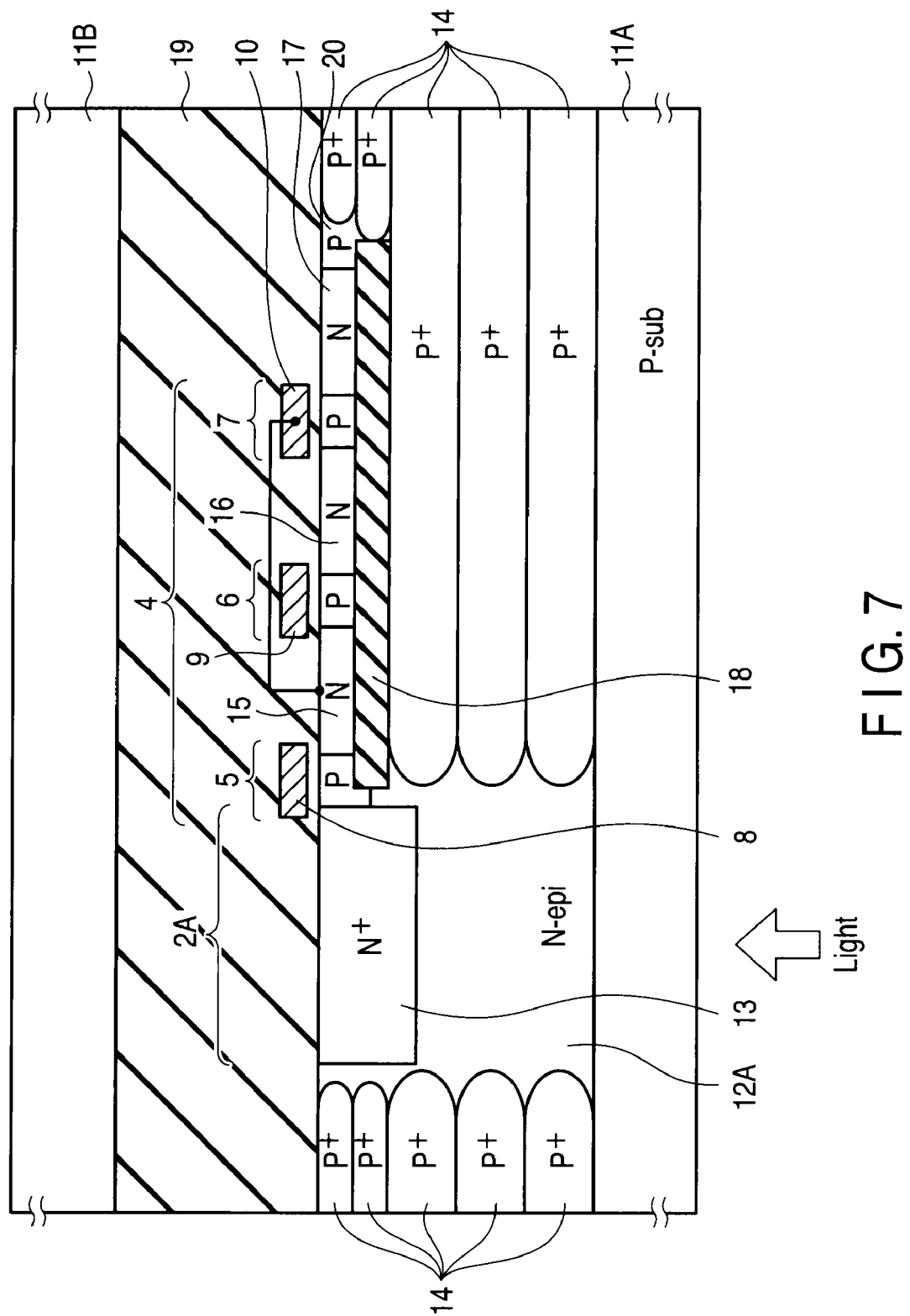

FIGS. 7 and 8 show back-illumination-type CMOS image sensors.

The device structure in FIG. 7 corresponds to the device structure in FIG. 3, and the device structure in FIG. 8 corresponds to the device structure in FIG. 4.

These device structures have a feature that semiconductor substrate 11B is adhered to interlayer insulator 19 in the side where pixel transistor 4 is formed. In this case, semiconductor substrate 11A in a side opposite to the side where pixel transistor 4 is formed is polished to become a thin film according to a method such as CMP.

In the back-illumination-type CMOS image sensors, light is incident from the side of the semiconductor substrate 11A. Therefore, obstacles such as interconnections formed on pixel transistor 4 need not be taken into consideration when determining a numerical aperture.

(2) Camera Module

Figure 9:
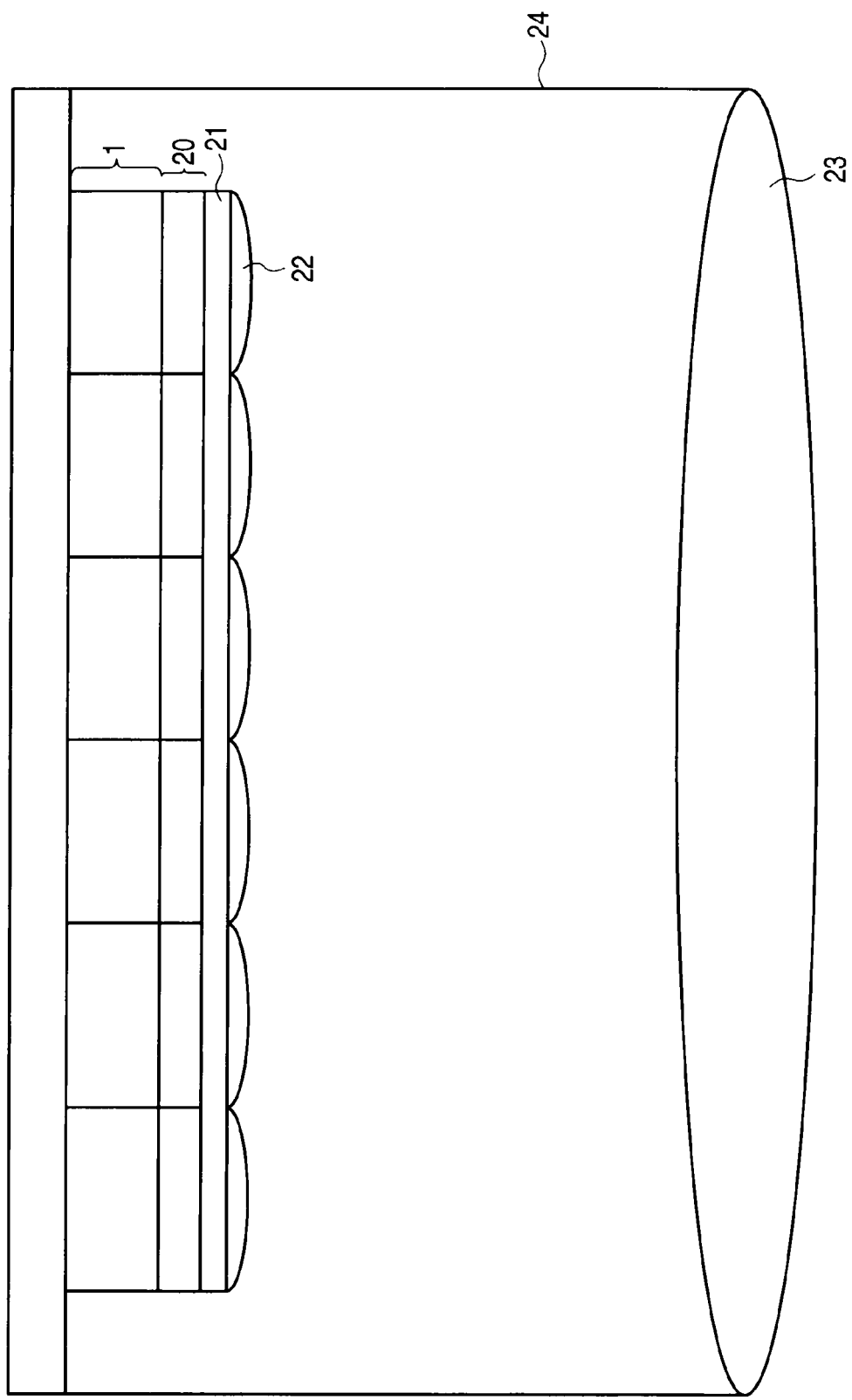
FIG. 9 is an overall view of a camera module.
Figure 10:
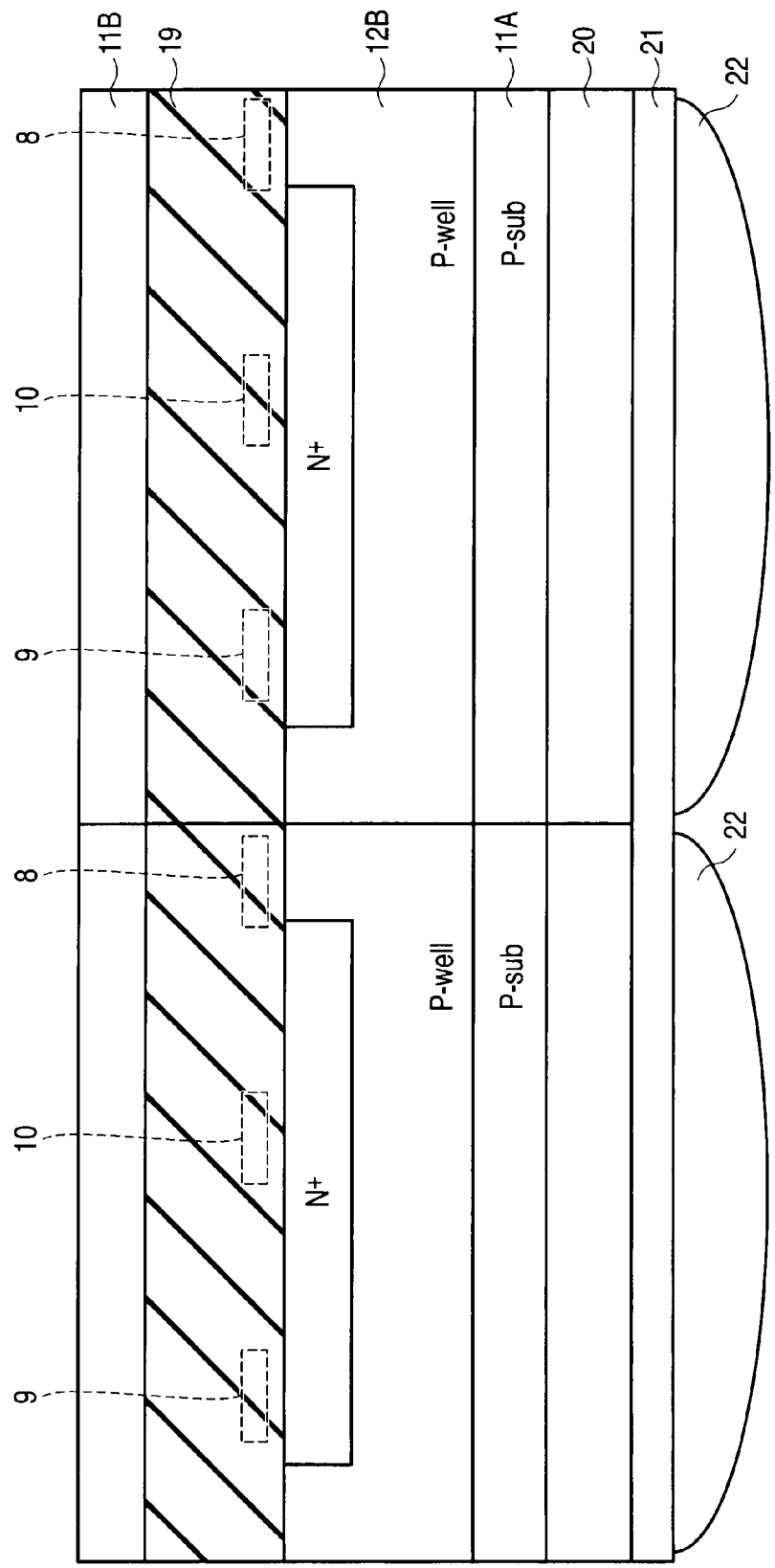
FIG. 10 is a view showing a part of a camera module.

FIG. 9 shows a whole camera module. FIG. 10 shows a main part of the camera module.

Here, the back-illumination-type CMOS image sensor in FIG. 8 is employed as an example of CMOS image sensor (chip) 1. In FIG. 10, the same components as those in FIG. 8 are denoted at the same reference symbols as in FIG. 8.

CMOS image sensor 1 is mounted inside a package 24. Micro lens 22 guides light to CMOS image sensor 1. Color filter 20 and flattened layer 21 are provided between CMOS image sensor 1 and micro lens 22.

Module lens 23 guides light to micro lens 22.

4. Modification Example

The solid-state image sensor according to the disclosure is applicable not only to CMOS image sensors but also to image sensors such as CCDs.

In the examples described above, pixel transistors are constituted by N-channel FETs, and photodiodes are constituted by a P-type semiconductor substrate and N-type epitaxial layers (N+-type diffusion layers).

The solid-state image sensor according to the disclosure is not limited to a configuration of a conductive type as described above but is applicable also to a configuration of an inverted conductive type thereof.

5. Conclusion

According to the present invention, signal noise of solid-state image sensors can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image sensor comprising:
   a semiconductor layer having a first conductive type;
   diffusion layers which are arranged in the semiconductor layer, each having a second conductive type, and each comprising a pixel;
   a pixel transistor disposed on the semiconductor layer;
   an insulating layer which is disposed under the pixel transistor and which is not disposed under the diffusion layers;
   an interlayer insulator on the semiconductor layer, which covers the pixel transistor;
   a first semiconductor substrate which is disposed under the semiconductor layer; and
   a second semiconductor substrate which is disposed on the interlayer insulator,
   wherein light is incident from the first semiconductor substrate to the diffusion layers.

2. The sensor according to claim 1,
   wherein the pixel transistor is disposed between pixels different from a pixel electrically connected to the pixel transistor.

3. The sensor according to claim 1,
   wherein bottom surfaces of the diffusion layers are located at a point lower than an upper surface of the insulating layer.

4. The sensor according to claim 1,
   wherein the semiconductor layer is an epitaxial layer on a semiconductor substrate.

5. The sensor according to claim 1,
   wherein the semiconductor layer is a well region in a semiconductor substrate.

6. The sensor according to claim 1,
   wherein each of the diffusion layers has a square shape, and the pixel transistor is connected to a corner of the square shape.

7. A solid-state image sensor comprising:
   a semiconductor layer having a first conductive type;
   diffusion layers which are arranged in the semiconductor layer, each having a second conductive type, and each comprising a pixel;
   a pixel transistor disposed on the semiconductor layer;
   an insulating layer which is disposed under the pixel transistor and which is not disposed under the diffusion layers;
   an interlayer insulator on the semiconductor layer, which covers the pixel transistor;
   a first semiconductor substrate which is disposed under the semiconductor layer; and
   a second semiconductor substrate which is disposed on the interlayer insulator,
   wherein light is incident from the second semiconductor substrate to the diffusion layers.

8. The sensor according to claim 7,
   wherein the pixel transistor is disposed between pixels different from a pixel electrically connected to the pixel transistor.

9. The sensor according to claim 7,
   wherein bottom surfaces of the diffusion layers are located at a point lower than an upper surface of the insulating layer.

10. The sensor according to claim 7,
    wherein the semiconductor layer is an epitaxial layer on a semiconductor substrate.

11. The sensor according to claim 7,
    wherein the semiconductor layer is a well region in a semiconductor substrate.

12. The sensor according to claim 7,
    wherein each of the diffusion layers has a square shape, and the pixel transistor is connected to a corner of the square shape.

13. A solid-state image sensor comprising:
    a semiconductor layer having a first conductive type;
    diffusion layers which are arranged in the semiconductor layer, each having a second conductive type, and each comprising a pixel;
    a pixel transistor disposed on the semiconductor layer; and
    an insulating layer which is disposed under the pixel transistor and which is not disposed under the diffusion layers,
    wherein each of the diffusion layers has a square shape, and the pixel transistor is connected to a corner of the square shape.

14. The sensor according to claim 13,
    wherein the pixel transistor is disposed between pixels different from a pixel electrically connected to the pixel transistor.

15. The sensor according to claim 13,
    wherein bottom surfaces of the diffusion layers are located at a point lower than an upper surface of the insulating layer.

16. The sensor according to claim 13,
    wherein the semiconductor layer is an epitaxial layer on a semiconductor substrate.

17. The sensor according to claim 13,
    wherein the semiconductor layer is a well region in a semiconductor substrate.

18. The sensor according to claim 13, further comprising:
    an interlayer insulator on the semiconductor layer, which covers the pixel transistor;
    a first semiconductor substrate which is disposed under the semiconductor layer; and
    a second semiconductor substrate which is disposed on the interlayer insulator.

19. The sensor according to claim 18,
    wherein light is incident from the first semiconductor substrate to the diffusion layers.

20. The sensor according to claim 18,
    wherein light is incident from the second semiconductor substrate to the diffusion layers.

* * * * *